(12) United States Patent
Salter et al.

(10) Patent No.: US 11,272,641 B2
(45) Date of Patent: Mar. 8, 2022

(54) MOUNTING BRACKET HAVING ELECTRICAL AND THERMAL PROPERTIES

(71) Applicant: Ford Global Technologies, LLC, Dearborn, MI (US)

(72) Inventors: Stuart C. Salter, White Lake, MI (US); Paul Kenneth Dellock, Northville, MI (US); John Budaj, Dearborn, MI (US); Estefania Rojas Silva, Nicolás Romero (MX); Marko Escalante, Miramar, FL (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/823,976

(22) Filed: Mar. 19, 2020

(65) Prior Publication Data

US 2021/0298204 A1   Sep. 23, 2021

(51) Int. Cl.
| | |
|---|---|
| *H05K 7/20* | (2006.01) |
| *B32B 27/18* | (2006.01) |
| *B32B 27/36* | (2006.01) |
| *B32B 27/32* | (2006.01) |
| *H05K 5/02* | (2006.01) |
| *F28F 9/007* | (2006.01) |
| *B60R 11/00* | (2006.01) |
| *H05K 3/30* | (2006.01) |

(52) U.S. Cl.
CPC ......... *H05K 7/20418* (2013.01); *B32B 27/18* (2013.01); *B32B 27/32* (2013.01); *B32B 27/36* (2013.01); *B60R 11/00* (2013.01); *F28F 9/0075* (2013.01); *H05K 3/301* (2013.01); *H05K 5/0204* (2013.01); *H05K 7/20854* (2013.01); *B32B 2264/108* (2013.01)

(58) Field of Classification Search
CPC ..................................................... H05K 3/301
See application file for complete search history.

(56) References Cited

U.S. PATENT DOCUMENTS

| 5,004,561 A | * | 4/1991 | Nomura | C08K 3/04 |
|---|---|---|---|---|
| | | | | 252/502 |
| 2011/0221649 A1 | * | 9/2011 | Price | H01P 3/085 |
| | | | | 343/850 |

FOREIGN PATENT DOCUMENTS

WO   WO-2018135916 A1  *  7/2018  ............... B32B 9/00

* cited by examiner

*Primary Examiner* — Alicia J Sawdon
(74) *Attorney, Agent, or Firm* — Frank Lollo; Eversheds Sutherland (US) LLP (57) ABSTRACT

Example embodiments described in this disclosure are generally directed to a mounting bracket for deployment in a vehicle. In one embodiment, a multilayer mounting bracket includes a first layer made of a dual-conductive polymer and a second layer made of a polymer that includes an endothermic blowing agent. The dual-conductive polymer includes carbon material that renders the first layer electrically conductive and also includes graphite material that renders the first layer thermally conductive. The endothermic blowing agent renders the second layer thermally insulative. An electronic module such as an engine controller can be mounted upon the first layer, which operates as a heat sink to dissipate heat generated by the electronic module and also operates as an electromagnetic interference (EMI) shield. The second layer prevents heat from being transferred from the first layer into another electronic module that may be mounted upon the mounting bracket.

6 Claims, 6 Drawing Sheets

MOUNTING BRACKET HAVING ELECTRICAL AND THERMAL PROPERTIES

FIELD OF THE DISCLOSURE

This disclosure generally relates to mechanical mounts, and more particularly relates to a mounting bracket for use in a vehicle.

BACKGROUND

A vehicle typically includes a large number of components. Many of these components are located in enclosed areas such as an engine compartment of the vehicle. Mechanical components are generally designed to withstand various adverse conditions such as high temperature, humidity, and wetness. Electronic components such as an engine controller circuit board or a climate control circuit board, are typically mounted inside an enclosure so as to prevent water and dirt from affecting the operations of these components. Some enclosures are made of metal while others are made of non-metallic materials such as ABS plastic. Metal enclosures provide certain advantages such as strength, durability, and resistance to impacts. However, metal enclosures add weight to the vehicle and it is generally desirable to minimize weight without compromising integrity.

Reducing weight not only applies to metal enclosures but is also applicable to other vehicle components such as mounting brackets that are used for attaching various components to a chassis of the vehicle. Mounting brackets made of metal can provide certain benefits from a mechanical point of view as well as from an electrical point of view. However, such metal parts can be heavy and can adversely impact manufacturing cost. Mounting brackets made of plastic tend to be light weight and relatively less expensive to manufacture than metal mounting brackets. However, plastic parts are not good conductors. For example, a plastic mounting bracket does not provide electrical connectivity to ground when so desired for an electrical device mounted upon the plastic mounting bracket.

It is therefore desirable to manufacture vehicle components such as mounting brackets that are light weight, yet offer benefits such as strength, heat conductivity, and electrical conductivity.

BRIEF DESCRIPTION OF THE DRAWINGS

A detailed description is set forth below with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

In terms of a general overview, certain embodiments described in this disclosure are directed to a mounting bracket that may be used for mounting electronic assemblies upon a chassis of a vehicle. In an example embodiment, a multilayer mounting bracket includes a first layer made of a dual-conductive polymer and a second layer made of a polymer that includes an endothermic blowing agent. The dual-conductive polymer includes a first quantity of carbon material and a first quantity of graphite. The carbon material endows upon the first layer, a desirable electrical conductivity characteristic and a desirable thermal conductivity characteristic. The endothermic blowing agent endows upon the second layer, a desirable thermal insulation characteristic.

An electronic module such as an engine controller, for example, can be mounted upon an external major surface of the first layer. The first layer operates as a heat sink to dissipate heat generated by the electronic module and can also operate as an electromagnetic interference (EMI) shield. The second layer prevents heat from being transferred from the first layer into the chassis of the vehicle and/or into any other electronic module that may be mounted upon the mounting bracket.

ILLUSTRATIVE EMBODIMENTS

The disclosure will be described more fully hereinafter with reference to the accompanying drawings, in which example embodiments of the disclosure are shown. This disclosure may, however, be embodied in many different forms and should not be construed as limited to the example embodiments set forth herein. It will be apparent to persons skilled in the relevant art that various changes in form and detail can be made to various embodiments without departing from the spirit and scope of the present disclosure. Thus, the breadth and scope of the present disclosure should not be limited by any of the above-described example embodiments but should be defined only in accordance with the following claims and their equivalents. The description below has been presented for the purposes of illustration and is not intended to be exhaustive or to be limited to the precise form disclosed. It should be understood that alternate implementations may be used in any combination desired to form additional hybrid implementations of the present disclosure. For example, any of the functionality described with respect to a particular device or component may be performed by another device or component. Furthermore, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments.

Certain words and phrases are used herein solely for convenience and such words and terms should be interpreted as referring to various objects and actions that are generally understood in various forms and equivalencies by persons of ordinary skill in the art. It should also be understood that the word "example" as used herein is intended to be non-exclusionary and non-limiting in nature. More particularly, the word "example" as used herein indicates one among several examples, and it should be understood that no undue emphasis or preference is being directed to the particular example being described.

Figure 1:
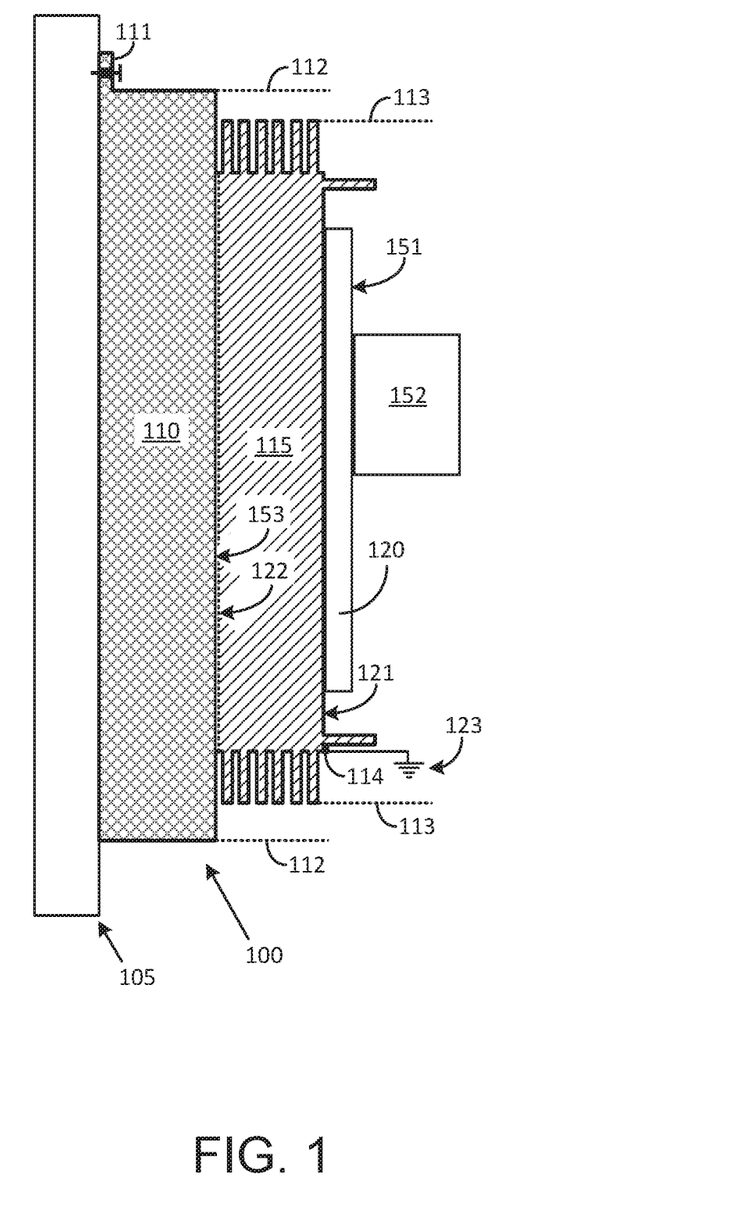
FIG. 1 shows a first example embodiment of a mounting bracket in accordance with the disclosure.

FIG. 1 shows a first example embodiment of a mounting bracket in accordance with the disclosure. The mounting bracket is a multilayer mounting bracket 100 that includes two layers in this example implementation. In other implementations, more than two layers can be provided. A molding process in accordance with the disclosure may be used to fabricate the multilayer mounting bracket 100 as a monolithic object that includes a first layer 115 and a second layer 110. The first layer 115 is composed of a dual-conductive polymer and the second layer 110 is composed of an insulating polymer. The dual-conductive polymer may be thermoformable, and/or the insulating polymer may be thermoformable. The phrase "dual-conductive" as used in this disclosure pertains to a combination of an electrically conductive characteristic and a thermally conductive characteristic. The word "insulating" as used in this disclosure pertains to a thermal insulating characteristic.

Polymers, particularly synthetic polymers such as plastic, nylon, and Teflon® are typically poor conductors of electricity but do provide some level of thermal insulation. For example, nylon can operate as an electrical insulator due to a high surface resistivity and volume resistivity (each about $10^{16}$ ohms/cm). Some thermoplastics provide poor thermal conductivity and can therefore operate as thermal insulators. For example, the thermal conductivity of one type of polymer is about 0.25 W/m.K. This type of material can be used where thermal insulation is desired.

The dual-conductive polymer that is used for fabricating the first layer 115 is a modified polymer that has an electrically conductive characteristic as well as a thermally conductive characteristic. The dual-conductive polymer can be formulated by introducing a carbon material and a graphite material into a base polymer such as for example, polybutylene terephthalate (PBT), polypropylene, or polyethylene. The introduction of the carbon material into the base polymer endows the base polymer with an electrical conductivity characteristic that allows for propagation of an electrical current through the modified base polymer. The introduction of the graphite material into the base polymer endows the base polymer with a thermal conductivity characteristic that allows for heat transfer through the modified base polymer.

The magnitude of the electrical current that is propagated through the modified base polymer may be adjusted based on the amount of carbon material introduced into the base polymer. A larger amount of carbon material allows for higher electrical conductivity. The amount of heat transfer that takes place through the modified base polymer may be adjusted based on the amount of graphite introduced into the base polymer. A larger amount of graphite allows for greater heat transfer through the modified base polymer.

The combination of high electrical current conductivity and high thermal conductivity provided by the dual-conductive polymer can be used in various applications where such a combination is desirable. In one example application in accordance with the disclosure, the dual-conductive polymer can be used to conduct electro-magnetic interference (EMI) currents to ground and to conduct heat away from an object. The EMI currents may be generated due to EMI radiation from an electronic circuit assembly that is located close to, or in contact with, the dual-conductive polymer. The high thermal conductivity of the dual-conductive polymer can be used to conduct heat away from an electronic circuit assembly located close to, or placed in contact with, the dual-conductive polymer.

In an example implementation in accordance with the disclosure, a carbon black material such as ENSACO® 350G manufactured by Imerys®, can be added to a base polymer such as polybutylene terephthalate (PBT). The amount of carbon black material that is added may be about 8% of the amount of PBT used for the formulation. The introduction of this amount of carbon black material can reduce a surface resistivity of PBT to about $10^3$ ohms/cm and a volume resistivity to about $5 \times 10^3$ ohm.cm (measured using ASTM D257 test methodology). The surface resistivity of PBT may be reduced in a range between about $10^3$ ohms/cm and about $10^1$ ohms/cm by introducing carbon black material in a range of about 8% to about 40% to the PBT. Also added to the base polymer is a graphite material such as TIMREX® C-THERM™ manufactured by Imerys®. The amount of graphite material that is added may be about 20% of the amount of PBT used for the formulation. The introduction of this amount of the graphite material can increase the thermal conductivity of PBT from about 0.2 W/m.K to about 4.0 W/m.K in a planar direction along a surface of the PBT and 1.5 W/m.K through the PBT, which equates to about twenty times improvement in thermal conductivity of PBT. A range of thermal conductivity between about 8 W/m.K to about 20 W/m.K may be achieved by introducing graphite material in a range of about 20% to about 40% of the amount of PBT used for the formulation. Roughly 2% to 3% of a maleic anhydride may be added to the base polymer when a ceramic addictive is to be made compatible with the base polymer.

In some example implementations in accordance with the disclosure, base polymers such as polypropylene or polyethylene may be used in place of PBT. Such base polymers may be selected based on considerations such as cost and performance. For example, polyether ether ketone (PEEK) or polybutylene succinate (PPS) may be used as the PBT material when high temperature performance features are desired.

The second layer 110 in the example multilayer mounting bracket 100 is composed of an insulating polymer that is formulated by using PBT as a base polymer. The inherent thermal conductivity of the base polymer in this case is about 0.25 W/m.K and can be reduced by adding a material such as an endothermic blowing agent. The phrase "endothermic blowing agent" as used in this disclosure encompasses various types of substances that can produce a cellular structure in various materials that undergo hardening or phase transition (such as polymers, plastics, and certain types of metals). The cellular structure operates as a matrix that reduces a density of the base material thereby increasing thermal insulation. Some endothermic blowing agents may be classified as physical blowing agents (such as a chlorofluorocarbon or a hydrochlorofluorocarbon). Others may be classified as chemical blowing agents (such as an isocyanate), mixed physical/chemical blowing agents, mechanically generated blowing agents (foam, froth or bubbles), and fillers (such as solid sodium chloride crystals).

In an example implementation in accordance with the disclosure, an endothermic chemical foaming agent is added to a base material such as polybutylene terephthalate (PBT). One example of such an endothermic chemical foaming agent is Foamazol™ manufactured by Bergen International®. The endothermic chemical foaming agent produces a microcellular structure in the base material. The amount of the endothermic chemical foaming agent that is introduced into the PBT may be about 20% of the amount of PBT used for the formulation. The introduction of this amount of endothermic chemical foaming agent can reduce the thermal conductivity of the base material to about 0.13 W/m.K. In another example implementation in accordance with the disclosure, a gas can be injected into the base material such as PBT for creating a microcellular foam structure.

The example multilayer mounting bracket 100 shown in FIG. 1 can be mounted upon a support structure 105. The support structure 105 can be, for example, a chassis of a vehicle or an enclosure of an electronic device such as a radio-frequency (RF) transmitter or a communication apparatus. The multilayer mounting bracket 100 may be attached to the support structure 105 by using an attachment member 111 that can include items such as, for example, a tab, a bolt, a rivet, and/or a fastener.

The multilayer mounting bracket 100 is generally configured to remove heat generated by an electronic module 120 that is mounted upon an external major surface 121 of the first layer 115. A few examples of the electronic module 120 can include a printed circuit board assembly (PCBA) that is a part of onboard computer of a vehicle that communicates wirelessly with various other components in the vehicle, or a controller module of a vehicle that communicates wirelessly with various other components in the vehicle. In various other applications, the electronic module 120 can be a component that is not a part of a vehicle, such as, for example, an RF transmitter apparatus, a radio communications apparatus, or a switching power supply unit.

As described above, the first layer 115 is composed of a dual-conductive polymer that includes carbon and graphite. The carbon endows a desirable electrical conductivity characteristic to the first layer 115 and the graphite endows a desirable thermal conductivity characteristic to the first layer 115. The electrical conductivity characteristic of the first layer 115 allows the multilayer mounting bracket 100 to operate as an EMI shield that routes to ground any EMI current that may be generated in the first layer 115 when the electronic module 120 is in operation. The EMI currents may be conducted to a ground node 123 via a connection arrangement that can include a connection member 114 such as, for example, a tab or a lug and items such as, for example, a bolt, a fastener, a conducting wire, and/or a grounding rod.

The thermal conductivity characteristic to the first layer 115 allows the multilayer mounting bracket 100 to operate as a heat dissipator for dissipating heat that may be generated by the electronic module 120 and transferred into the first layer 115 when the electronic module 120 is in operation. In one example application, the electronic module 120 can include a printed circuit board (PCB). Some components mounted on an obverse major surface 151 of the PCB, such as a power supply module 152, for example, may generate heat when the electronic module 120 is in a powered state.

A reverse major surface of the PCB may be arranged to be in direct contact with the external major surface 121 of the first layer 115. Direct contact is permissible because the amount of carbon present in the dual-conductive polymer of the first layer 115 is selected to provide adequate electrical conductivity to EMI currents generated in the first layer 115 but not adequate to provide electrical conductivity to higher amplitude electrical currents that may cause shorting of electrical contacts on the reverse major surface of the PCB.

Direct contact of the reverse major surface of the PCB with the external major surface 121 of the first layer 115 allows for efficient heat conduction from the PCB into the first layer 115. In an example method of fabrication, the direct contact feature may be provided by molding the dual-conductive polymer directly upon the reverse major surface of the PCB or by molding the dual-conductive polymer directly upon at least a part of the electronic module 120. The example first layer 115 shown in FIG. 1 includes a number of radiating fins that may be provided for dissipating heat from the first layer 115 via air-cooling. The radiating fins can be excluded in other applications.

In some cases, the electronic module 120 can include the power supply module 152. The power supply module 152 may be packaged in a metal enclosure or may be packaged in a non-metallic enclosure made of a potting compound. A major surface of the metallic or non-metallic enclosure may be arranged to be in direct contact with the external major surface 121 of the first layer 115 so as to accommodate efficient heat conduction into the first layer 115 from the power supply module 152.

The second layer 110 is composed of an insulating polymer that attenuates or prevents heat that may be present in the first layer 115 from being transferred into the support structure 105. A boundary 122 between the second layer 110 and the first layer 115 may be a contiguous boundary that is formed by molding or depositing the dual-conductive polymer of the first layer 115 upon the insulating polymer of the second layer 110.

In an example implementation, a footprint of the second layer 110 upon the support structure 105 is larger than a footprint of the first layer 115 upon the second layer 110. This aspect is illustrated by a dashed line 112 defining a perimeter of the second layer 110 and a dashed line 113 defining a perimeter of the first layer 115. The perimeter of the second layer 110 is larger than the perimeter of the first layer 115. The larger perimeter of the second layer 110 can be configured to block heat radiated by the first layer 115 from reaching the support structure 105.

Figure 2:
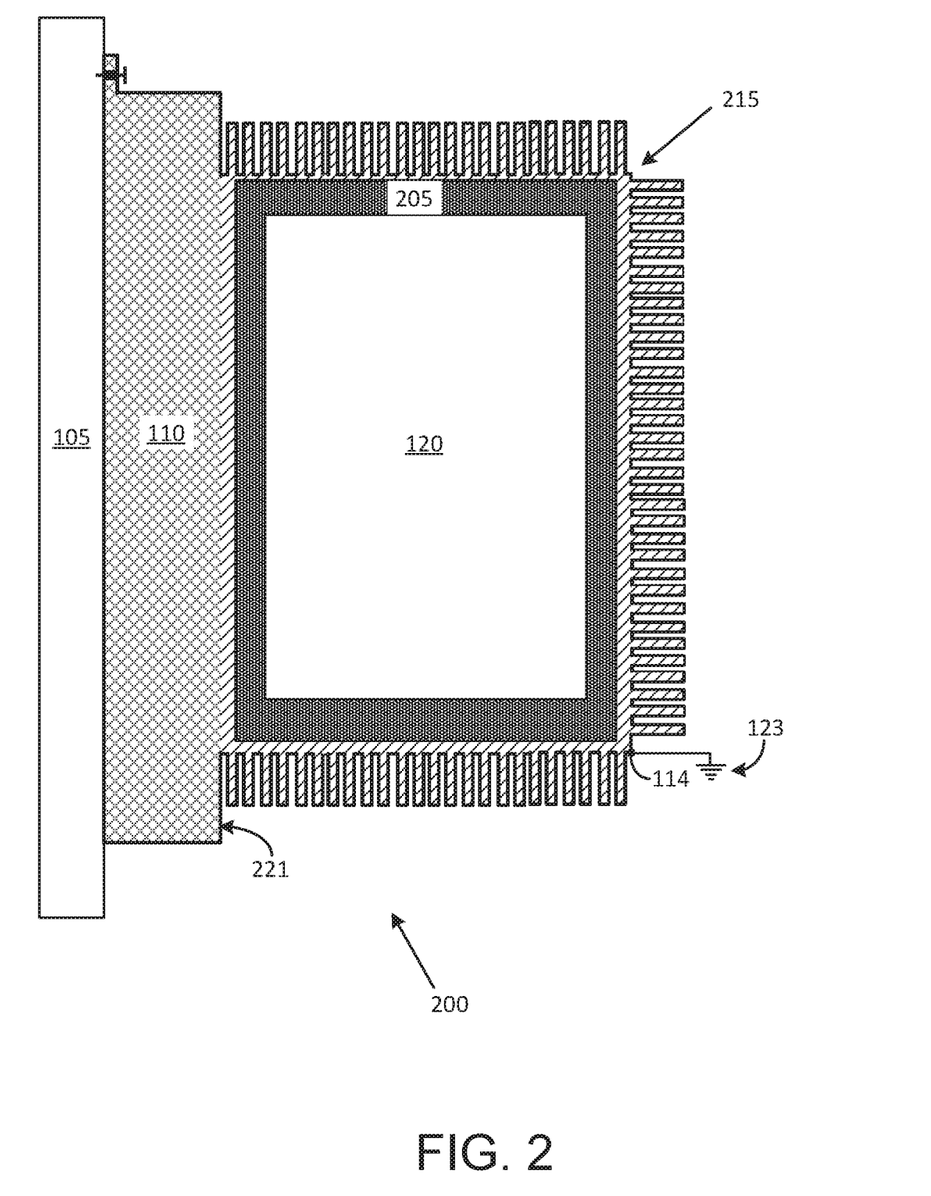
FIG. 2 shows a second example embodiment of a mounting bracket in accordance with the disclosure.

FIG. 2 shows a second example embodiment of a mounting bracket in accordance with the disclosure. The mounting bracket in this second example embodiment is a multilayer mounting bracket 200 that is a monolithic item and includes two layers in the manner described above with respect to the multilayer mounting bracket 100. The form factor and layout of the first layer 215 of the multilayer mounting bracket 200 is different than that of the first layer 115 multilayer mounting bracket 100. More particularly, the form factor of the first layer 215 in this embodiment is adapted to orient the electronic module 120 at right angles to a major surface 221 of the second layer 110.

The first layer 215 can include a recessed area 205 in which the electronic module 120 is seated. The recessed area 205 can be a part of a compartment in the electronic module 120. Orienting the electronic module 120 at right angles to the major surface 221 of the second layer 110 allows a first portion of heat that may be present in the first layer 215 (due to heat generation in the electronic module 120) to be dissipated into the air surrounding the electronic module 120. The multilayer mounting bracket 200 can include the connection member 114 for conducting EMI currents from the first layer 215 to the ground node 123.

In an example implementation of this embodiment, the multilayer mounting bracket 200 can be configured as a container that houses the electronic module 120. The container, which may include a lid (not shown) can be attached to the electronic module 120 by using a molding process. The molding process can include depositing the dual-conductive polymer of the first layer 215 directly upon one or more surfaces of the electronic module 120.

Figure 3:
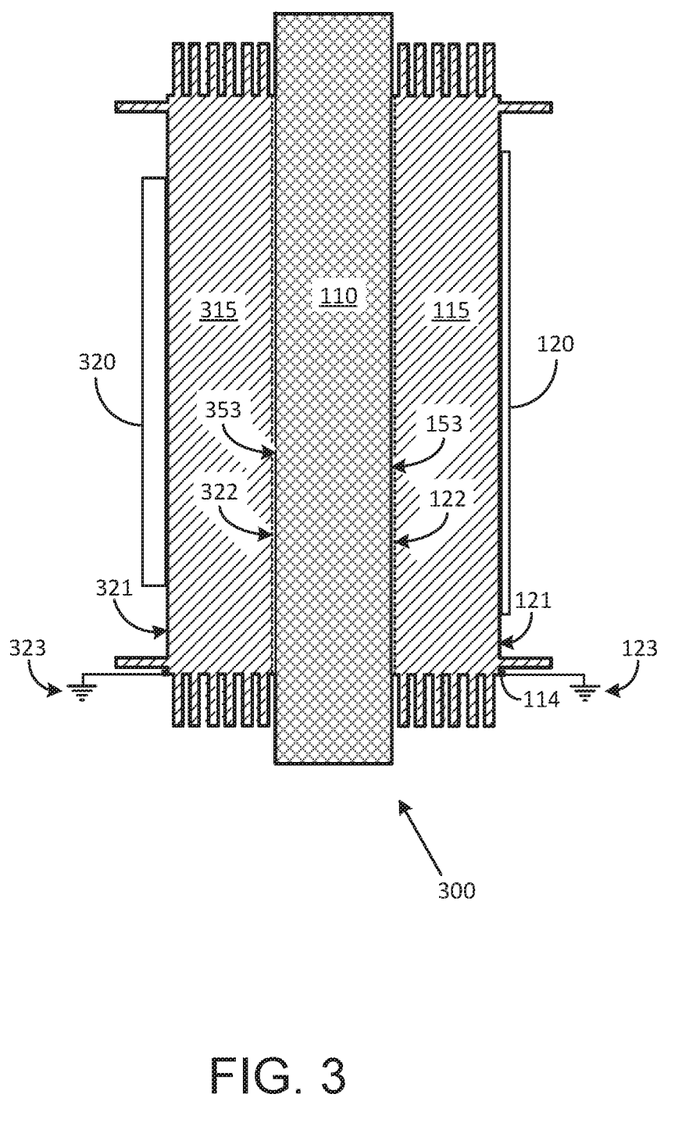
FIG. 3 shows a third example embodiment of a mounting bracket in accordance with the disclosure.

FIG. 3 shows a third example embodiment of a mounting bracket in accordance with the disclosure. The mounting bracket in this third example embodiment is a multilayer mounting bracket 300 that is a monolithic item and includes three layers. The three layers include the first layer 115 and the second layer 110 that are described above and further includes a third layer 315. The third layer 315 is composed of a dual-conductive polymer that is substantially similar, or identical, to the dual-conductive polymer of the first layer 115. In the example implementation shown in FIG. 3, the form factor of the third layer 315 is a mirrored replica of the form factor of the first layer 115. In other implementations, the characteristics of the dual-conductive polymer contained in the third layer 315 can be different than the characteristics of the dual-conductive polymer contained in the first layer 115. For example, the dual-conductive polymer contained in the third layer 315 may have a different electrical conductivity than that of the first layer 115. Furthermore, in other implementations, the form factor of the third layer 315 can be different than the form factor of the first layer 115.

As indicated above, the boundary 122 (shown in a dashed line format) between the second layer 110 and the first layer 115 may be a contiguous boundary that is formed by molding or depositing the dual-conductive polymer of the first layer 115 upon an obverse surface 153 of the second layer 110. The boundary 322 (shown in a dashed line format) between the second layer 110 and the third layer 315 may also be a contiguous boundary that is formed by molding or depositing the dual-conductive polymer of the third layer 315 upon a reverse surface 353 of the second layer 110.

The multilayer mounting bracket 100 is configured to remove heat generated by the electronic module 120 that is mounted upon an external major surface 121 of the first layer 115 and heat generated by another electronic module 320 that is mounted upon an external major surface 321 of the third layer 315. The electronic module 320 may be identical to, or different than, the electronic module 120. In one example application, the multilayer mounting bracket 100 may be housed in a vehicle. The electronic module 320 can be a controller module that controls some components in the vehicle and the electronic module 120 can be an onboard computer that controls engine operations and some other operations of the vehicle.

One or both of the electronic module 320 and the electronic module 120 may utilize wireless circuitry to communicate with various components of the vehicle, and/or may contain circuitry that generates heat. The wireless circuitry may produce EMI currents in the first layer 115 and/or in the third layer 315. The EMI currents that may be present in the first layer 115 can be grounded to the ground node 123 and the EMI currents that may be present in the third layer 315 can be grounded to a ground node 323. In some cases, the ground node 123 may be different than the ground node 323. For example, the ground node 123 may be provided in a chassis component of the vehicle and the ground node 323 may be provided in an engine block of the vehicle.

Heat produced in the electronic module 120 can be dissipated in the first layer 115 and heat produced in the electronic module 320 can be dissipated in the third layer 315. The second layer 110 that contains the insulating polymer provides thermal insulation between the first layer 115 and the third layer 315. Consequently, heat produced in the electronic module 120 is prevented from passing through the second layer 110 and adversely affecting the electronic module 320, or vice-versa.

Figure 4:
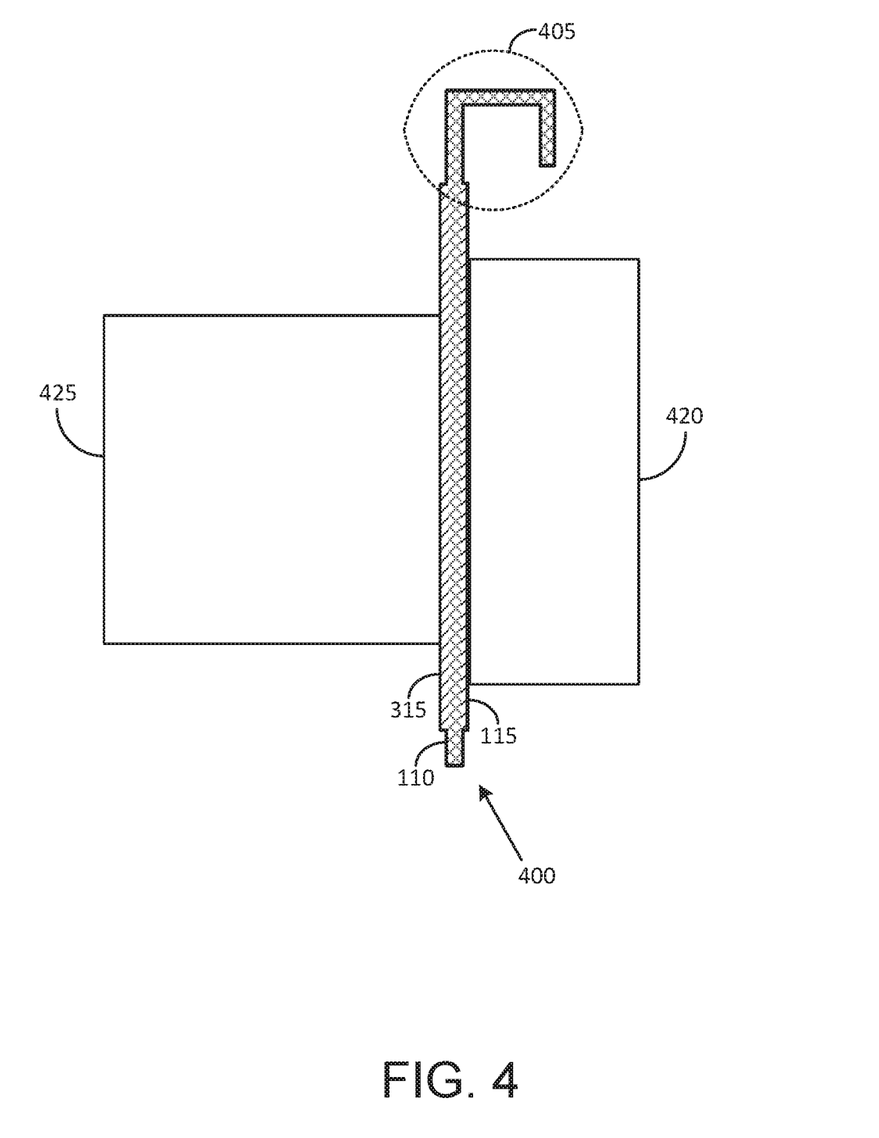
FIG. 4 shows a fourth example embodiment of a mounting bracket in accordance with the disclosure.

FIG. 4 shows a fourth example embodiment of a mounting bracket in accordance with the disclosure. The mounting bracket in this fourth example embodiment is a multilayer mounting bracket 400 that includes the first layer 115, the second layer 110, and the third layer 315 which are described above with respect to the multilayer mounting bracket 300. The form factor and shape of the multilayer mounting bracket 400 is different than that of the multilayer mounting bracket 300. The multilayer mounting bracket 400 includes an attachment member 405 that may be used to mount the multilayer mounting bracket 400 upon a support structure such as, for example, a chassis of a vehicle. In one example application, an electronic module 420 is mounted upon the first layer 115 and another electronic module 425 is mounted upon the third layer 315. The second layer 110, which is composed of an insulating polymer, attenuates, or prevents, heat generated by the electronic module 425 from being transferred into the electronic module 420, and vice-versa.

Figure 5:
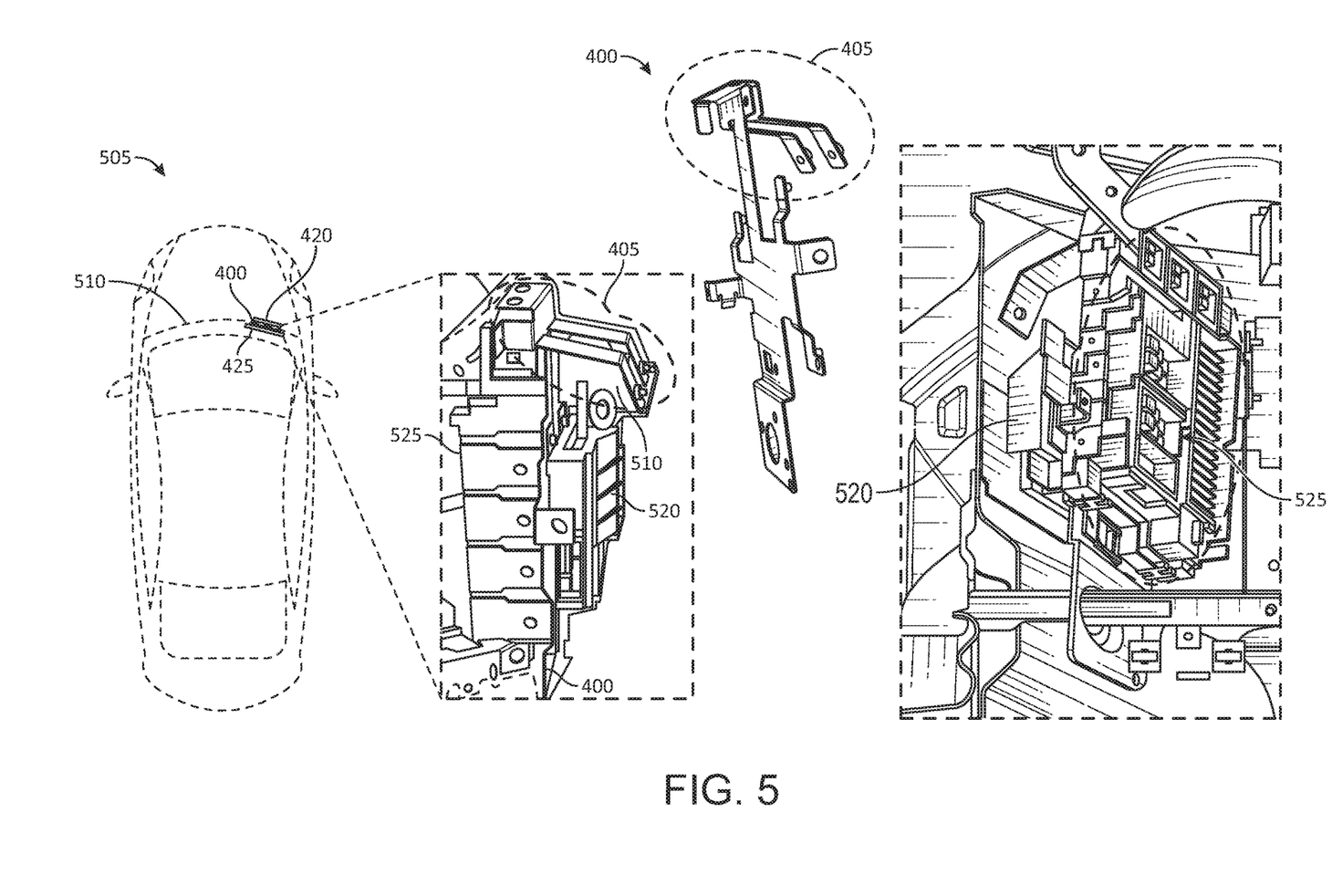
FIG. 5 shows a mounting bracket mounted on a vehicle in accordance with an example embodiment of the disclosure.

FIG. 5 shows an example use of the multilayer mounting bracket 400 in a vehicle 505 in accordance with an embodiment of the disclosure. The attachment member 405 of the multilayer mounting bracket 400 is attached to a chassis portion 510 of the vehicle 505. In this example implementation, the electronic module 425 is a body control module (BCM) 525 and the electronic module 420 is an engine control unit (ECU) 520. The BCM 525 can be a processor-based power distribution apparatus that supervises and controls functions related to various parts of the vehicle 505, such as lights, windows, security, door locks, access control, and various comfort controls. The ECU 520 can be another processor-based power distribution apparatus that supervises and controls various engine-related operations of the vehicle 505. In one example case, the BCM 525 can have an operating temperature range between −40° C. and +85° C. and the ECU 520 may have an ambient temperature radiation of about +85° C. The multilayer mounting bracket 400 operates as a thermal insulator that attenuates, or prevents, the heat generated by the ECU 520 from being transferred into the BCM 525. The multilayer mounting bracket 400 further operates as a heat sink to transfer the heat generated by the ECU 520 into the chassis portion 510 of the vehicle 505 and also as an EMI shield between the BCM 525 and the ECU 520.

In addition to providing thermal and electrical benefits, the multilayer mounting bracket 400 can offer various mechanical benefits and cost benefits. For example, the multilayer mounting bracket 400 can have a lower weight and a lower manufacturing cost in comparison to a metal bracket, and can also have a complex shape that conforms to various space limitations in a vehicle. For example, the multilayer mounting bracket 400 can have a complex shape to accommodate mounting of the BCM 525 and the ECU 520 in a confined portion of an engine compartment or chassis of the vehicle 505.

Figure 6:
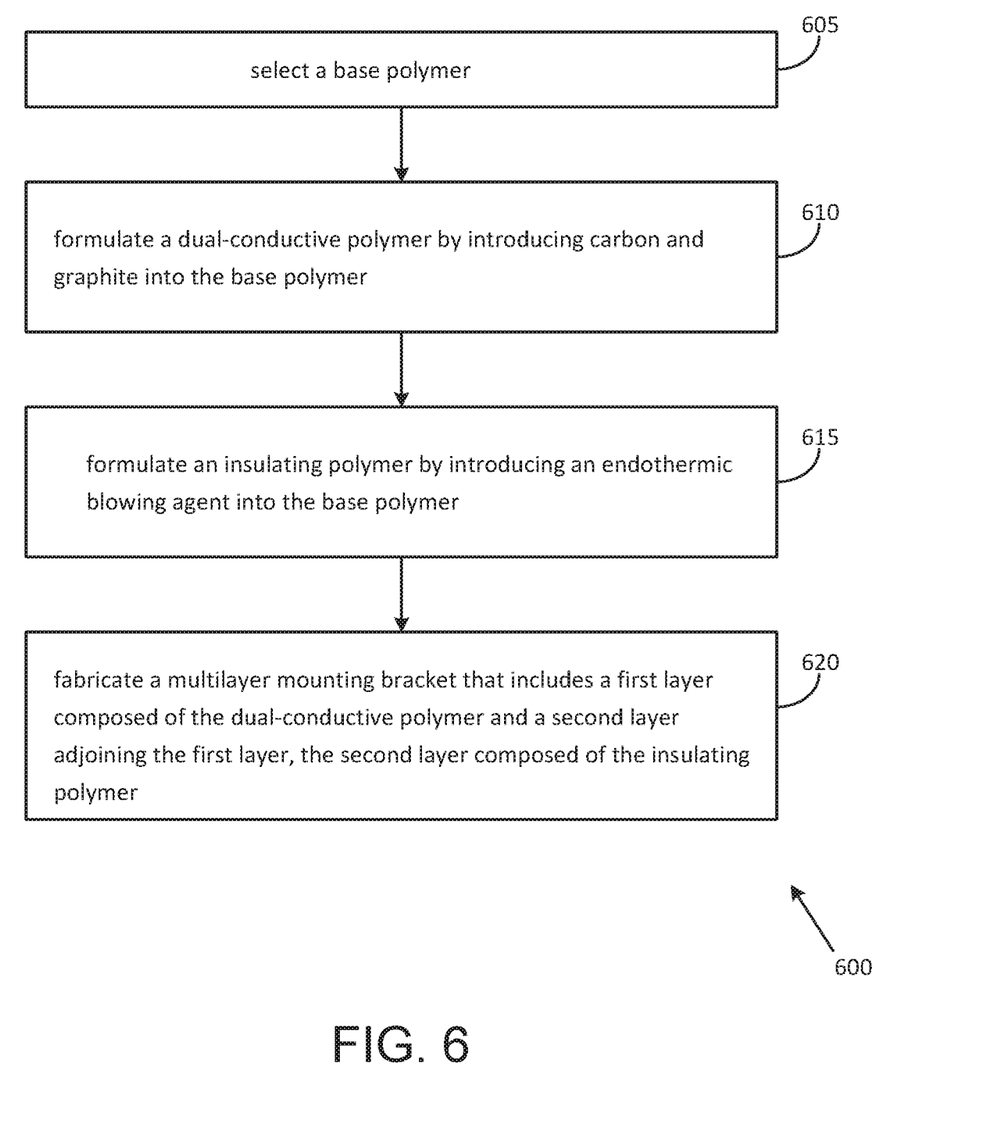
FIG. 6 shows a flowchart of an example method for fabricating a multilayer mounting bracket in accordance with the disclosure.

FIG. 6 shows a flowchart 600 of an example method in accordance with the disclosure for fabricating a multilayer mounting bracket. The flowchart 600 illustrates a sequence of operations that can be implemented in various ways. The order in which the operations are described is not intended to be construed as a limitation, and any number of the described operations may be carried out in a different order, omitted, combined in any order, and/or carried out in parallel.

At block 605, a base polymer may be selected. The base polymer can be a thermoformable polymer that is moldable by using heat. A few examples of base polymers that may be selected in various embodiments in accordance with the disclosure, include polybutylene terephthalate (PBT), polypropylene, polyethylene, polyether ether ketone (PEEK) and polybutylene succinate (PPS). Various considerations pertaining to cost and performance may be taken into consideration when selecting the base polymer.

At block 610, a dual-conductive polymer may be formulated by introducing carbon and graphite into the base polymer. The amount of carbon that is introduced into the base polymer can be based on a desired amount of electrical conductivity. The desired amount of electrical conductivity may be based on various considerations such as characteristics of EMI currents that may be introduced into the dual-conductive polymer from an electronic module when the electronic module is placed in contact with, or located near, the dual-conductive polymer. The amount of carbon that may be introduced into the base polymer may be determined by various methods such as, for example, by product testing, by using a priori data, by executing empirical procedures, and/or by executing trial-and-error procedures. These methods may involve adding more carbon if more electrical conductivity is desired and removing some of the added carbon to reduce electrical conductivity.

The amount of graphite that is introduced into the base polymer can be based on a desired amount of thermal insulation. The desired amount of thermal insulation may be based on various considerations such as an amount of heat that may be introduced into the dual-conductive polymer from an electronic module when the electronic module is placed in contact with, or located near, the dual-conductive polymer. The amount of graphite that may be introduced into the base polymer may be determined by various methods such as, for example, by product testing, by using a priori data, by executing empirical procedures, and/or by executing trial-and-error procedures. These methods may involve adding more graphite if more thermal insulation is desired and removing some of the added graphite to reduce thermal insulation. In some cases, the amount of graphite added or removed may be further determined based on an amount of carbon that is added to, or removed from, the dual-conductive polymer, because the carbon may also affect the thermal characteristics of the dual-conductive polymer in conjunction with the graphite.

At block 615, an insulating polymer may be formulated by introducing an endothermic blowing agent into the base polymer. The quantity of endothermic blowing agent that is introduced into the base polymer can be adjusted to obtain a desired amount of insulation. For example, the thermal conductivity of the insulating polymer may be lowered by removing a portion of the endothermic blowing agent that has been introduced into the base polymer. Conversely, the thermal conductivity of the insulating polymer may be increased by adding some more endothermic blowing agent into the base polymer. In some cases, the base polymer used for formulating the insulating polymer may be different than the base polymer that is used to formulate the dual-conductive polymer described above. The type of endothermic blowing agent used may be determined based on various considerations such as cost and desired insulation characteristics.

At block 620, a multilayer mounting bracket may be fabricated by using the dual-conductive polymer and the insulating polymer. In one example application, a two-layer mounting bracket can be fabricated by using a two-pass molding process. The first pass of the two-pass molding process may involve injecting the insulating polymer into a mold. The mold may conform to a desired shape of the two-layer mounting bracket. The second pass of the two-pass molding process may involve injecting (or depositing) the dual-conductive polymer upon an exposed surface of the insulating polymer.

In another example application, a three-layer mounting bracket can be fabricated by using a three-pass molding process. The three-pass molding process can be an extension of the two-pass molding process described above. After completion of the first pass where the insulating polymer is injected into the mold and the second pass where the dual-conductive polymer is injected upon the exposed surface of the insulating polymer (an obverse surface of the insulating polymer), the dual-conductive polymer is injected upon a reverse surface of the insulating polymer. The insulating polymer is now an intermediate layer located between a first layer formed of the dual-conductive polymer and a second layer formed of the dual-conductive polymer.

In yet another example application, a three-layer mounting bracket can be fabricated by using a two-shot injection molding process in which a foamed insulation plastic is shot first for fabricating an intermediate layer of the three-layer mounting bracket. Thermally conductive material is then shot on both major surfaces of the intermediate layer.

The three-layer mounting bracket may be used in various applications such as, for example, the vehicle application described above with reference to FIG. 4 and FIG. 5.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described example embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. An assembly, the assembly comprising:
    a first electronic module; and
    a multilayer mounting bracket comprising:
        a first layer comprising a first polymer that includes a first quantity of carbon and a first quantity of graphite, the first layer having a first electrical conductivity characteristic and a first thermal conductivity characteristic based on the first quantity of carbon and the first quantity of graphite in the first layer, the first electronic module disposed upon an external major surface of the first layer,
        wherein the first layer includes a grounding element that electrically connects the first layer to a ground node; and
        a second layer adjoining the first layer, the second layer comprising a second polymer that includes an endothermic blowing agent, the second layer having a thermal insulation characteristic based on the second layer having the endothermic blowing agent.

2. The assembly of claim 1, wherein at least one of the first polymer or the second polymer is one of polybutylene terephthalate (PBT), polypropylene, or polyethylene.

3. The assembly of claim 1, wherein the first polymer is one of polybutylene terephthalate (PBT), polypropylene, or polyethylene, wherein the first quantity of carbon comprises carbon black in a first range of about 8% to about 40% of an amount of the first polymer, and wherein the first quantity of graphite comprises graphite in a second range of about 20% to about 40% of the amount of the first polymer.

4. The assembly of claim 1, wherein the multilayer mounting bracket is mounted to a structure using an attachment member, and wherein the attachment member is at least one of a tab, a bolt, a rivet, or a fastener.

5. The assembly of claim 1, wherein the first layer adjoins an obverse major surface of the second layer, and further comprising:
    a third layer adjoining a reverse major surface of the second layer, the third layer comprising a third polymer that includes a second quantity of carbon and a second quantity of graphite, the second layer having a second electrical conductivity characteristic and a second thermal conductivity characteristic based on the second quantity of carbon and the second quantity of graphite in the second layer.

6. The assembly of claim 5, further comprising a second electronic module on an external major surface of the second layer.

* * * * *